United States Patent [19]

Hudson, Jr.

[11] 4,021,729
[45] May 3, 1977

[54] CROSS-FIELD GROUND FAULT SENSOR

[75] Inventor: Edward C. Hudson, Jr., Derry, N.H.

[73] Assignee: I-T-E Imperial Corporation, Spring House, Pa.

[22] Filed: Dec. 3, 1975

[21] Appl. No.: 637,233

[52] U.S. Cl. ............................ 324/51; 324/117 R; 324/127; 336/175; 340/255; 361/45
[51] Int. Cl.² .................. G01R 31/02; G01R 19/16
[58] Field of Search ............ 324/51, 117, 127, 133; 317/18 R, 18 B, 18 D; 340/255, 253 H, 253 N; 336/175, 178, 229

[56] References Cited

UNITED STATES PATENTS

| 2,739,285 | 3/1956 | Windsor | 324/117 R |
| 3,135,911 | 6/1964 | Van Allen | 324/117 R X |
| 3,183,498 | 5/1965 | Midis et al. | 324/117 R X |
| 3,617,809 | 11/1971 | Penn et al. | 317/18 D |
| 3,699,442 | 10/1972 | Riley | 324/117 R X |
| 3,732,463 | 5/1973 | Dale | 317/18 D |
| 3,786,356 | 1/1974 | MacPhee | 317/18 D |
| 3,812,428 | 5/1974 | Trenkler | 324/127 |

FOREIGN PATENTS OR APPLICATIONS

| 1,263,178 | 3/1968 | Germany | 324/117 |
| 1,283,374 | 11/1968 | Germany | 324/117 |
| 2,002,656 | 7/1971 | Germany | 324/117 |

Primary Examiner—Gerard R. Strecker
Attorney, Agent, or Firm—Ostrolenk, Faber, Gerb & Soffen

[57] ABSTRACT

A differential transformer having a core of low permeability ferromagnetic material, a pair of identical primary windings and a secondary winding of relatively few turns capable of producing a large voltage output for a small magnitude ground fault current. A cross-field winding is utilized to periodically saturate a portion of the flux path in the transformer core to produce sudden changes in magnetic flux, which flux changes vary in magnitude proportional to the amount of fault current. During the time interval when the cross-field portion of the sensor is not saturated by a pulse of sampling current, a second pulse of current is introduced into the sensor secondary winding for detecting a grounded neutral wire by sensing the output voltage produced in response thereto.

24 Claims, 10 Drawing Figures

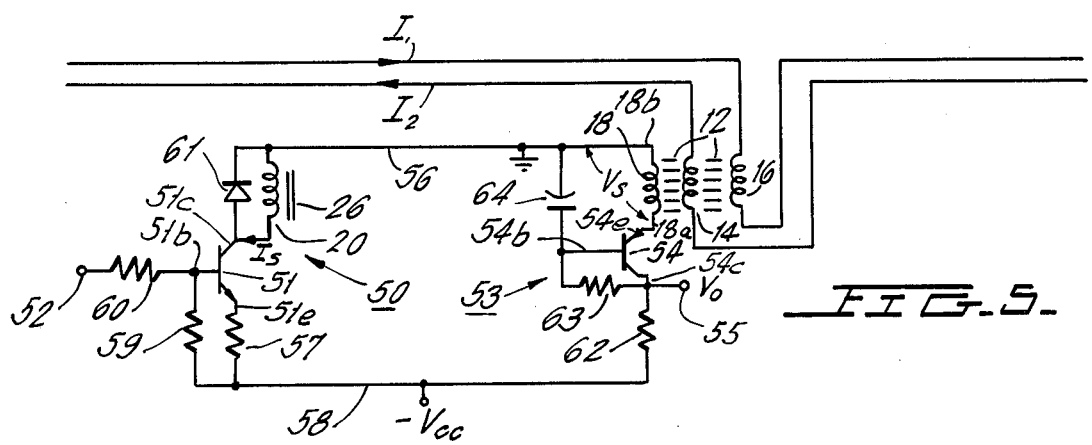
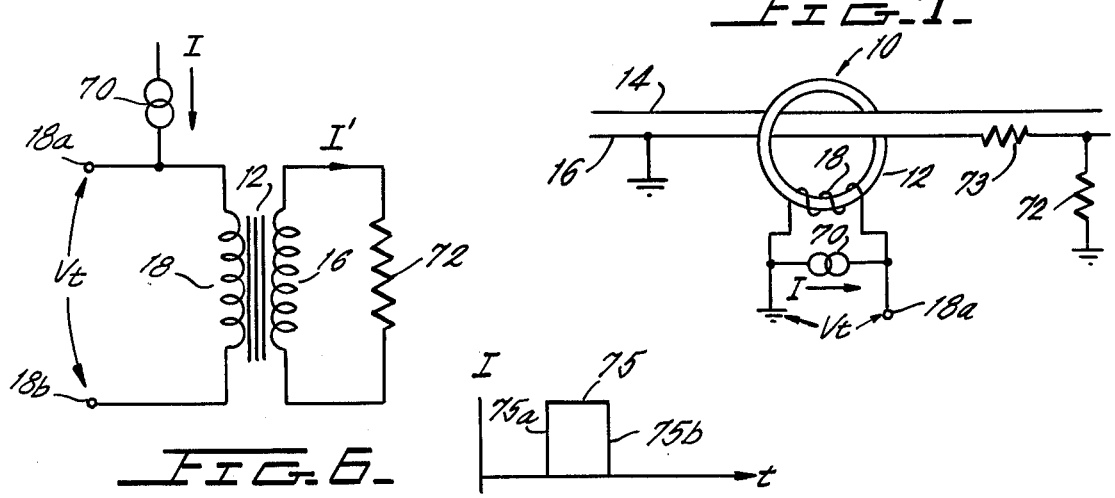
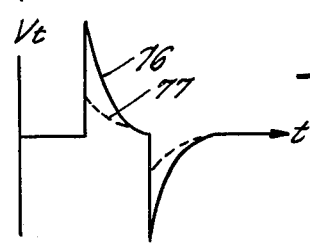
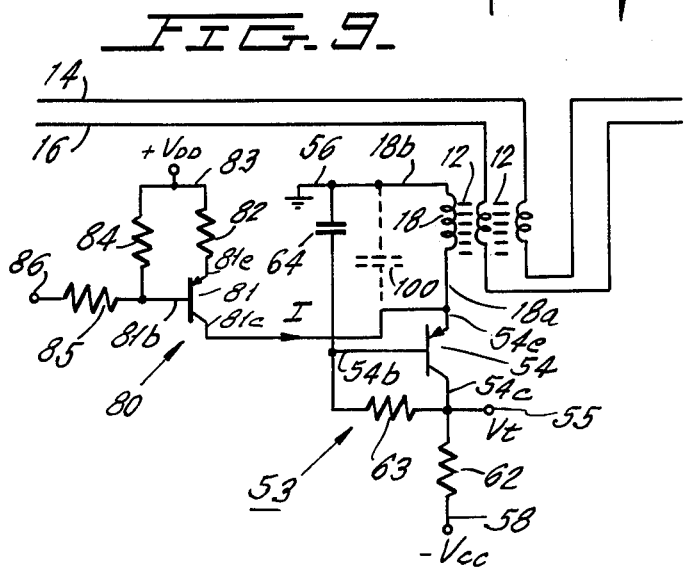
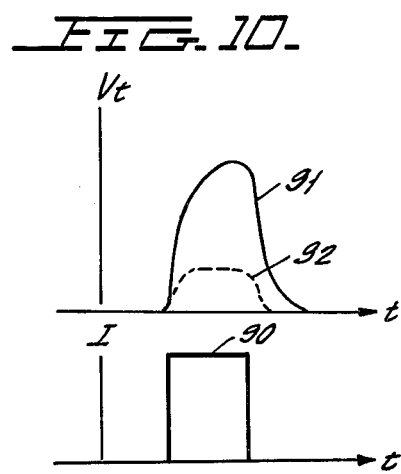

CROSS-FIELD GROUND FAULT SENSOR

BACKGROUND OF THE INVENTION

The present invention relates to ground fault detection equipment and more particularly relates to a novel ground fault sensor using a cross-field magnetic path to interrupt the flow of magnetic flux in a transformer core to produce a large voltage output proportional to the amount of fault current while permitting use of a small amount of low permeability core material and relatively few secondary winding turns.

It is well-known in the art that a ground fault conditions, i.e. a high impedance path from one of a pair of power lines to earth ground, may be detected by use of a differential transformer having a pair of primary windings and a secondary winding. A flow of current in a pair of power lines attached to the primary windings induces a flow of magnetic flux in the transformer core, each power line causing a flow of flux in an opposite direction. When no ground fault condition exists, each flux is of equal magnitude and opposite phase to the other; a zero net flux is coupled to the secondary winding. In the event of a ground fault condition, the current in one primary winding exceeds the current in the other primary winding and a non-zero net flux is induced in the transformer core. This non-zero flux induces a voltage in the transformer secondary, which secondary voltage is detected to initiate the rapid interruption of the current flow in the monitored circuit.

The fault current detected by a ground fault detector unit is usually of a very slowly varying nature, typically having a frequency related to the line frequency, e.g., 60 Hertz. The low frequency has required the magnetic core to have a very large physical size; the low magnitude of fault current which it is desired to detect has required the differential transformer core to be of a high permeability magnetic material and to have a secondary winding consisting of a large number, typically in excess of 1000, of turns of fine wire. The secondary winding output voltage has been relatively small, due to the slowly varying nature of the signal and the small instantaneous change in net flux caused thereby. The large mass of high permeability magnetic material is expensive, as is the cost of properly winding a continuous multi-thousand turn secondary of fine wire.

Known methods for detecting a grounded neutral line condition have utilized a separate circuit to inject a voltage across the neutral line and to sense the magnitude of a current responsive thereto.

BRIEF SUMMARY OF THE INVENTION

It is desirable to utilize a single sensor for the detection of both the ground fault and grounded neutral line conditions, which sensor reduces the required amount of magnetic material and the number of secondary turns, while producing a relatively large output signal responsive to the slowly time varying signal, to allow the use of relatively simple detection circuitry in a more cost effective manner than hitherto possible.

In accordance with the invention, a cross-field ground fault sensor realizing the above-stated desirable characterisitcs, includes a generally toroidal core of low permeability magnetic material having at least one portion of the toroid shaped to form a second continuous loop of core material positioned such that a magnetic field formed therein is summed with the magnetic field formed in the toroid responsive to a difference in the magnitude of a current flowing in each of a first and a second primary winding formed about the toroid. The magnetic field in the second core portion temporarily saturates a portion of the flux path of the toroidal core responsive to a pulse of current injected into a saturation winding to cause a rapid cessation in the flow of flux and induce a large output voltage in a secondary winding of relatively few turns; the output voltage is proportional to the magnitude of the fault current as the initial flux within the toroidal core is proportional to the magnitude of the fault current.

The toroidal core is used for detecting a grounded neutral line condition by injecting a pulse of current of known mangitude into the transformer secondary, during the time interval between successive current pulses for sampling the fault current, to detect a change of resistance caused by the grounded neutral line by detecting the resulting voltage or impedance condition presented at the secondary of the transformer.

Circuitry for formation of a current pulse to detect the grounded netural line condition and for formation of a cross-field pulse to detect fault currents is shown and allows the use of one sensing core which is shared by the two detecting circuits.

The cross-field ground fault sensor just described has the advantage that it permits the detection of low magnitude ground fault currents and the detection of a grounded neutral line condition with a single sensor while producing a high output voltage from a secondary sensing winding having relatively few turns and requiring a core having a small amount of low permeability magnetic material, in an easily manufactured and highly cost-effective device.

Accordingly it is a primary object of the present invention to provide a novel sensor for the detection of a ground fault current.

It is another object of the present invention to detect such ground fault condition with a sensor having a high output mangitude to allow the utilization of simple ground fault detection circuitry.

A further object is to provide such sensor requiring a small amount of a low permeability magnetic core material and a secondary sensing winding of relatively few turns, for ease and low cost of manufacture.

A still further object is to detect a ground neutral line condition by the introduction of a current into the neutral line and the detection of a resulting voltage.

Another object is to allow a single sensing core to be shared for the detection of both the grounded neutral and the current fault conditions by the injection of such current into the sensor secondary winding as a pulse during the time when the sensor is not saturated for detection of a fault current.

The above as well as other objects of the invention will become apparent from the following description of the accompanying drawings.

BRIEF DESCRIPTION OF THE DRAWINGS

FIG. 5 is a schematic representation of circuitry for inducing saturation of the sensor and for generating an output voltage proportional to the magnitude of the fault current;

FIG. 6 is a schematic diagram illustrating the principle in accordance with the invention of injecting current to detect a grounded neutral line condition;

FIG. 7 is a schematic diagram illustrating the detection of a grounded neutral line condition by the cross-field ground fault sensor; ;

FIG. 8 is a graph illustrating the output voltage produced for a pulse of current injected into the sensor secondary winding for grounded neutral line detection;

FIG. 9 is a schematic diagram of a circuit for producing an injected current pulse in the sensor for grounded neutral line detection; and FIG. 10 is a graph illustrating the voltage output produced by the current pulse injection circuit of FIG. 9.

DETAILED DESCRIPTION OF THE INVENTION

Figure 1:
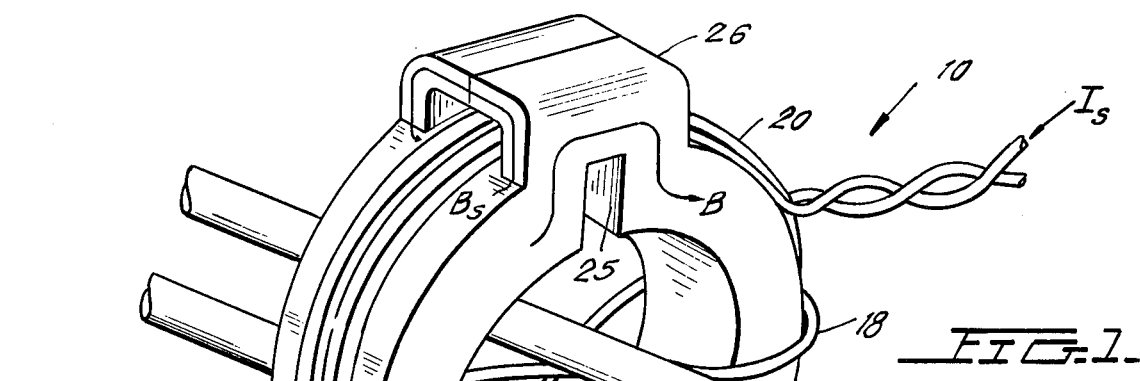
FIG. 1 is an isometric projection of a cross-field ground fault sensor in accordance with the invention.
Figure 3:
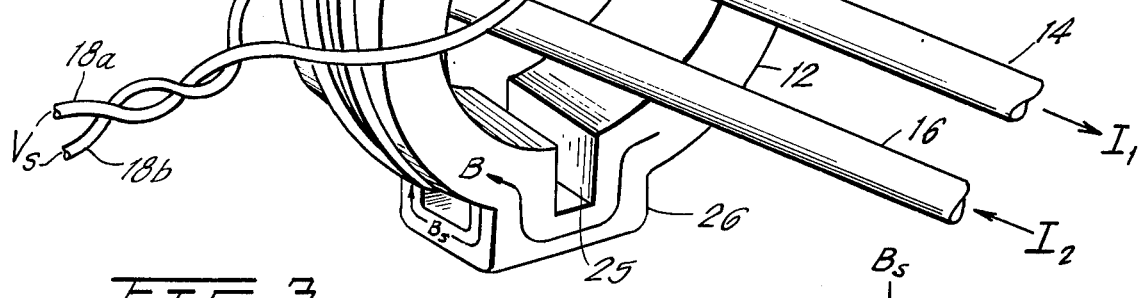
FIG. 3 is an isometric view of a portion of a crossfield ground fault sensor of FIG. 1, illustrating the production of a saturation region to interrupt the main flux path within the sensor core.
Figure 3:
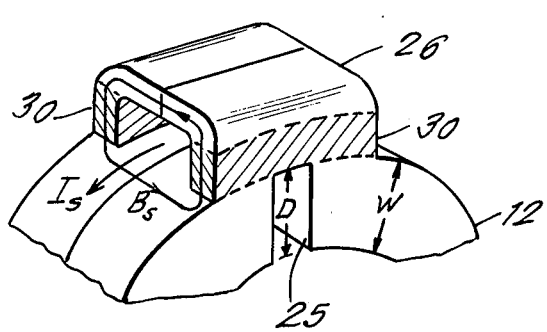
Figure 2:
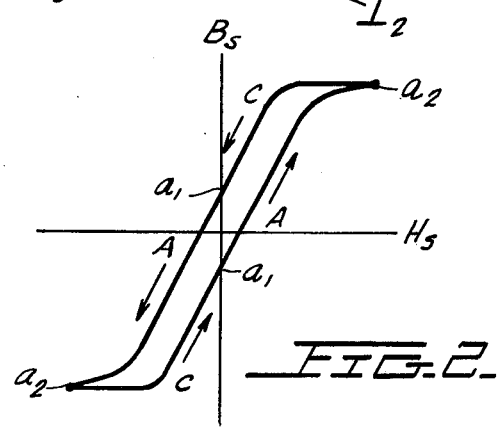
FIG. 2 is a graph of the magnetic flux density versus the magnetic field intensity for the core material of the sensor of FIG. 1.
Figure 4:
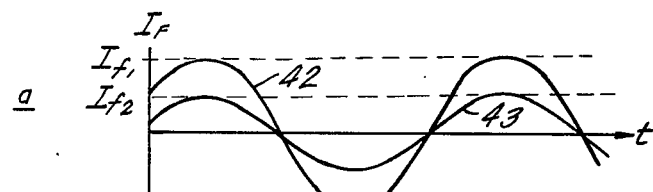
FIG. 4a, 4b and 4c graphically illustrate the time-amplitude relationships of the cross-field ground fault sensor in the ground fault mode.
Figure 4:
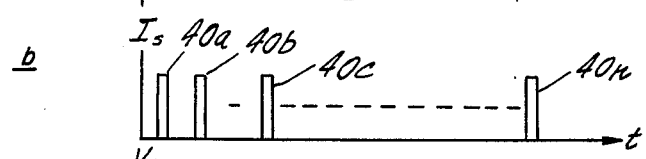
Figure 4:
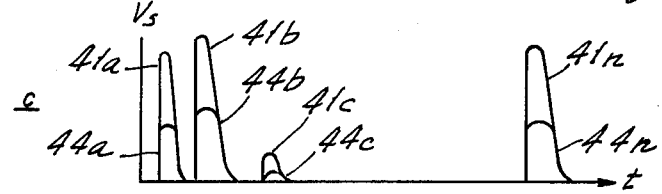

Referring initially to FIG. 1, cross-field sensor 10 includes a generally toroidal shaped pressed core 12 of low permeability magnetic material which is reasonably stable over a wide temperature range. A first current conductor 14 and a second current conductor 16 extend through the bore of core 12 from a source of A.C. electrical energy (not shown) to a load device (not shown). Under normal conditions i.e. no ground fault condition, a first current of mangitude $I_1$ flows in conductor 14 in the direction of arrow $I_1$ and induces a first magnetic flux density of magnitude $B_1$ in core 12 in the direction indicated by arrow B; a second current of magnitude $I_2$ flows in conductor 16 in the direction of arrow $I_2$ and induces a second magnetic flux density of mangitude $B_2$ in core 12 in a direction opposite arrow B. In the normal condition, $I_1 = I_2$ and $B_1 = B_2$, whereby the net magnetic flux density $B_0 = (B_1 - B_2) = 0$. A secondary winding 18 comprised of a relatively few number of turns is wound about the cross section of toroidal core 12. In a preferred embodiment, an equal number of turns of winding 18 are wound in a series additive manner about two diametrically opposed portions of the core with the conductor transposed between each section. A net magnetic flux density $B_0$ in core 12 induces a voltage in secondary winding 18, which voltage appears between a pair of leads 18a and 18b connected thereto. In the normal (no ground fault) condition, there is no voltage present at lead ends 18a and 18b as the zero net magnetic flux density ($B_0 = 0$) induces a secondary winding voltage of zero volts.

In the ground fault condition, one of the currents $I_1$, $I_2$ exceeds the other, whereby one of the magnetic flux densities B1, B2 induced respectively thereby, exceeds the other; the net magnetic flux density $B_0$ no longer equals zero and induces a voltage $V_S$ across the winding lead ends 18a and 18b. In the balanced differential transformer known to the prior art, the small number of turns of secondary winding 18 and the low permeability ($\mu$) of the core material would result in a voltage $V_s$ of such small mangitude as to be unusable.

A usable voltage of large magnitude is obtained by rapidly saturating a portion of core 12 to essentially instantaneously reduce the magnitude of flux density therein to be nearly zero; the voltage $V_s$ developed across secondary winding 18 is proportional to the permeability ($\mu$) of the core material, the number (N) of secondary turns, and the time derivative of flux ($\phi$) change, $V_s = N\mu (d\phi/dt)$. The voltage output is maximized when the flux induced in core 12 changes from an initial net flux value, proportional to the magnitude of the fault current $I_f = (I_1 - I_2)$, to a nearly zero final flux value, in a vanishingly small time interval. Thus, if a portion of core 12 is magnetically saturated whereby the flux path is broken responsive to a pulse of switching current $I_s$ having a rapid rise time associated with its leading edge, then the flux density decreases to almost zero in a small time period.

Referring now to FIGS. 1 through 4, core 12 includes at least one gap portion 25 having a depth D at least equal to the width W of core 12. A generally square cross-field core portion 26 is formed along the periphery of core 12, in the region of each gap 25, such that the magnetic field $B_s$ in core portion 26 is generally transverse to, and does not change by mutual induction, the magnectic field B in core 12. A cross-field winding 20 wound through the bore of all cross-field core portions 26, causes a magnetic field of flux density $B_s$ to flow in each secondary core in the direction shown by arrow $B_s$ responsive to a flow of current $I_s$ therein.

In the non-interrogated condition, i.e. with no current flowing in cross-field winding 20, the magnetic field intensity $H_s$, proportional to current $I_s$, is zero (FIG. 2), although the remanence of the magnetic material causes the second core magnetic flux density $B_s$ to have a non-zero value $a_1$. Upon application of a current $I_s$ of sufficient magnitude within cross-field winding 20, magnetic field intensity $H_s$ is sharply increased with the corresponding increase in magnetic flux density $B_s$ in the direction of arrow A. A point $a_2$ is reached at which $\mu$ of segments 30 is essentially reduced to unity so that further increases in magnetic field intensity $H_s$ produce only very small increases in magnetic flux density $B_s$. The cross sectional area of each segment 30 of core portion 26 is smaller than the cross sectional area of the top or bottom portions of second core portion 26.

Each of core segments 30 now appear as a gap in main core 12, causing the magnitude of magnetic flux density B to decrease to almost zero in a very short period of time. The voltage $V_s$ induced in the secondary winding during this short period of time is proportional to the magnitude of fault current $I_f$ and then falls to zero. At the cessation of the cross-field switching current $I_s$, the magnetic field intensity $H_s$ in second core portion 26 returns to a value of zero, the associated magnetic flux density $B_s$ returns to the remanent value $a_1$, as shown by arrows C, and the flow of main core magnetic flux density B is re-established, proportional to the value of fault current $I_f$, as core segments 30 are removed from saturation.

As the magnitude of the secondary output voltage $V_s$ is proportional to the time derivitive of flux, the cross-field switching current $I_s$ requires a waveform having the aforementioned rapid leading edge rise time and need only be maintained for a time interval sufficient for the secondary output voltage to stabilize and be sampled at the peak of its waveform. Core segments 30 are periodically saturated (FIG. 4) by a train of current pulses 40a, 40b, 40c . . . 40n, having the required rise time, duration and amplitude. In one preferred embodiment of the present invention, the duration of a pulse 40 is 5 microseconds, and the rise time is preferably less than one microsecond. The fault current $I_f$ is a slowly time-varying sinusoid having a peak amplitude proportional to the magnitude of the ground fault. Thus, a first ground fault current 42 of peak magnitude $I_{f1}$, representative of a fault condition current, produces a series of secondary winding output voltage pulses 41a, 41b, 41c ... 41n during a time interval generally coincident with each of the sampling current pulses 40 while a second sinusoidal ground fault current 43, having a magnitude one half that of the first ground fault current 42 produces a train of pulses 44a, 44b, 44c — 44n, having the same wave shape but only half the peak amplitude, the peak amplitudes being proportional to the fault current magnitude. The secondary winding output voltage $V_s$ will generally have an unusably small amplitude during all non-interrogated time intervals.

Referring now to FIG. 5, cross-field switching circuit 50 includes a semidonductor device 51 for causing a flow of switching current of magnitude and direction $I_S$ in cross-field winding 20 responsive to the presence of a sampling signal at an input terminal 52 thereof. The seconday voltage $V_s$ is an input to an amplifier circuit 53 which includes a second semiconductor device 54 for generating a proportional output voltage $V_o$ at an output terminal 55 thereof.

In a preferred embodiment of this interrogator-amplifier circuit for use with cross-field ground fault sensor 10, interrogator circuit 50 includes an NPN transistor 51 having a collector electrode 51c coupled to one lead of saturation winding 20, whose other lead is connected to a return bus 56 of D.C. power supply (not shown); an emitter electrode 51e coupled through an emitter bias resistor 57 to a supply bus 58 from the D.C. supply; and a base electrode 51b coupled through a first base bias resistor 59 to supply bus 58 and through an input resistor 60 to input terminal 52. The values of emitter resistor 57, base bias resistor 59 and input resistor 60 are predeterminately chosen such that, in the absence of an input signal, transistor 51 is in the cut-off state, whereby an essentially zero switching circuit $I_s$ flows through cross-field winding 20 to supply bus 58. A sample pulse of positive amplitude at input 52 causes transistor 51 to switch to the conducting state, whereby a pulse of sampling current $I_s$ of magnitude determined by the magnitude of the voltage pulse at 51b and the value of emitter resistance 57 flows in coil 20 in the direction of arrow $I_s$. A transient-suppression diode 61 is in electrical parallel connection across cross-field winding 20 to provide a path for $I_s$ to flow and decay to zero when transistor 51 is turned "off".

Amplifier circuit 53 includes a PNP transistor 54 having an emitter electrode 54e coupled to one lead 18a of secondary winding 18, whose other lead 18b is connected to return bus 56; a collector electrode 54c coupled through a load resistor 62 to supply bus 58; and a base electrode 54b coupled through a bypass capacitor 64 to secondary lead 18b and return bus 56. The values of load resistor 62 and third base bias resistor 63 are predeterminately chosen to bias transistor 54 in the active region, whereby the secondary output voltage $V_s$ developed across winding 18 varies the operating point of transistor 54 to cause a proportional output voltage $V_o$ to appear at output terminal 55 responsive to a sampling pulse of current $I_s$ in cross-field winding 20. During the time interval when interrogator circuit 50 is not producing a pulse of saturation current $I_s$ in cross field winding 20, the voltage $V_s$ at emitter electrode 54e has an essentially zero value. When interrogator circuit 50 causes a saturation current pulse 40 to flow through cross-field 20, the voltage at the emitter 54e pulses according to $V_s = -N\mu (d\phi/dt)$ and transistor 54 amplifies this pulse; current flows through load resistor 62 to produce a pulse of amplifier output voltage $V_o$ at terminal 55, which pulse has a peak magnitude proportional to the magnitude of fault current $I_f$ associated with core segment 30 being saturated. A pulse of sufficient magnitude at terminal 55 is detected by known means to interrupt the flow of current in conductors 14 and 16.

During the time interval when the fault current $I_f$ is not being sampled by a pulse 40 induced in cross-field winding 20, the grounded neutral condition can be detected by introducing a flow of current of predetermined magnitude and direction I through secondary winding 18 from a current source 70 (FIG. 6). This flow of current through the neutral line-to-ground impedance 72, as reflected through the transformer coupling, produces a voltage, by Ohm's Law, which voltage is measured to indicate a low impedance, or grounded condition. In a preferred embodiment, a rapid induced rate of current change per unit time and the electrical transformer action through core 12 induces the current transition in primary windings 14 and 16. A transformed current of magnitude I' flows through the neutral-line-to-ground impedance 72 to produce a voltage pulse having a magnitude proportional to the magnitude of impedance 72. The voltage pulse is transformed back through core 12 as a pulse of test voltage signal having a mangitude $V_t$ and appearing between secondary winding ends 18a and 18b; the larger the mangitude of test voltage $V_t$, the greater the impedance between neutral line 16 and earth ground.

Cross-field ground fault sensor 10 allows the grounded neutral line condition to be sensed when a fast rise time pulse having a short pulse width is introduced into secondary winding 18 to produce a large test current I' in neutral line 14 or 16, and a proportionally large test voltage $V_t$, even when the minimal number of primary turns of primary lines 14 and 16 results in a small value of primary winding magnetizing inductance. The residual resistance 73 of neutral conductor 16 is normally of a value sufficiently small such that the secondary winding voltage $V_t$ is proportional only to impedance 72 from neutral line 16 to earth ground; a small impedance 72 will produce a correspondingly small $V_t$.

Thus, referring to FIGS. 7–9, a current source 70 produces a current pulse 75 having rapid rise and fall times 75a and 75b, respectively. In the normal, i.e. non-grounded neutral line, condition, a corresponding pulse 76 of large test voltage mangitude $V_t$ is produced. In the grounded neutral line condition, a small value of impedance 72 produces a correspondingly smaller test voltage pulse 77 across secondary winding 18. The difference in test voltage peak magnitude between normal pulse 76 and grounded neutral pulse 77 is detected to signal the grounded neutral line condition. Current pulse 75 is introduced into secondary winding 18 during the time intervals between successive ground fault interrogation pulses 40 (FIG. 4), whereby a single cross-field ground fault sensor 10 is used to detect both the ground fault and the grounded neutral line conditions.

A preferred circuit for detecting a grounded neutral line condition utilizes amplifier circuit 53, as herein-above described, and a pulse current source circuit 80 including a second PNP transistor 81 having an emitter electrode 81e coupled through an emitter resistor 82 to a second power supply bus 83 having a positive voltage of magnitude $V_{DD}$ thereon; a base electrode 81b coupled through a fourth base bias resistor 84 to second supply bus 83 and through a second input resistor 85 to an input terminal 86; and a collector electrode 81c coupled to the junction formed at the connection of the amplifier transistor emitter electrode 54e and secondary winding lead 18a, for introducing a current of magnitude I therein in the direction of arrow I. The value of emitter resistor 82, fourth base bias resistor 84 and second input resistor 85 are predeterminately chosen such that transistor 81 is in the cutoff state whereby no current I flows through winding 18 to return bus 56 when input 86 is normally coupled to a positive voltage essentially equal to the voltage $V_{DD}$ on second supply bus 83. A negative-going voltage pulse at input 86, having a peak value essentially equal to zero volts, causes transistor 81 to conduct, whereby a current pulse 90 having a magnitude determined by the value of the pulse voltage at 81b divided by the resistance of emitter resistor 82 is induced through secondary winding 18 to return bus 58. As previously described, a voltage pulse is reflected from neutral-line-to-ground impedance 72 through core 12 to secondary winding 18, which voltage pulse changes the voltage at amplifier transistor emitter electrode 54e while capacitor 64 maintains a constant base electrode 54b voltage whereby voltage Vt of peak amplitude proportional to the magnitude of impedance 72 is produced at output terminal 55. Thus, in the normal condition where the neutral-line-to-ground impedance 72 is high, a large peak amplitude test voltage pulse 91 appears at output terminal 55 during the time duration of current pulse 90; in the grounded neutral line condition, the low neutral-line-to-ground impedance 72 causes a small peak amplitude test voltage pulse 92 to appear at output terminal 55 for detection to interrupt the continuity of conductors 14 and 16 from the energy source (not shown) to the utilization device (not shown).

In one preferred embodiment of this circuit for detecting a grounded neutral line condition using the cross-field sensor 10, amplifier circuit 53 is made to oscillate by the electrical parallel connection of a capacitor 100 across secondary winding 18. In this embodiment the magnitude of the neutral line to ground impedance 72 is reflected through the transformer to control the quality factor Q of the oscillator tank circuit composed of capacitor 100 and the inductance of secondary winding 18. A suitable detector as known to the art is coupled to output terminal 55 to detect the magnitude of Q damping due to the transformed grounded neutral line impedance 72. In this configuration, current impulse circuit 80 is modified by the connection of resistors 82 and 84 to return bus 58, whereby transistor 81 acts to quench oscillation of amplifier circuit 53 during the interval when a ground fault interrogation pulse 40 is introduced into cross-field winding 20.

There has just been described a cross-field ground fault sensor which permits the detection of both a low magnitude ground fault current and a grounded neutral line condition in a single sensor having relatively few secondary winding turns and requiring a core having a small amount of low permeability ferromagnetic material while producing a high output voltage, in an easily manufactured and highly cost-efficient sensor device.

The present invention has been described in connection with several preferred embodiments thereof; many variations and modifications will become apparent to those skilled in the art. It is preferred therefore, that the present invention be limited not by the specific disclosure herein, but only by the appended claims.

The embodiments of the invention in which an exclusive privilege or property is claimed are defined as follows:

1. A ground fault sensing circuit, comprising:
a first magnetic core having an air gap therein;
a first primary winding connected between one terminal of an A.C. source and one terminal of a load, a second primary winding connected between a second terminal of said A.C. source and a second terminal of said load, said primary windings being coupled to said first core in such a manner as to produce oppositely directed fluxes in said first core;
a secondary winding coupled to said first core to have induced therein a voltage related to the difference in magnitude of the currents flowing in said first and second primary windings;
a second magnetic core magnetically coupled to said first core in parallel magnetic circuit relationship with said air gap so as to provide an alternate magnetic path for said oppositely directed fluxes induced in said first core whenever said second core is not saturated;
a control winding coupled to said second core;
means for periodically energizing said control winding so as to periodically drive said second core into saturation at a relatively rapid rate whereby said oppositely directed fluxes induced in said first core change at a relatively rapid rate thereby increasing the magnitude of said voltage induced in said secondary winding.

2. A ground fault sensing circuit as claimed in claim 1 wherein the magnetic field induced in said second core by said control winding is generally transverse to, and does not change by mutual induction, the magnetic field induced in said first core by said primary windings.

3. A ground fault sensing circuit as claimed in claim 2 wherein said first and second cores are generally toroidal in shape, the axis of rotation of said first toroidal core being generally perpendicular to the axis of rotation of said second toroidal core.

4. A ground fault sensing circuit as claimed in claim 3 wherein said second generally toroidal core is integral with said first generally toroidal core.

5. A ground fault sensing circuit as claimed in claim 3 wherein said control winding includes a plurality of turns of conductive material wound about the periphery of said first toroidal core and through the bore of said second toroidal core.

6. A ground fault sensing circuit as claimed in claim 5 wherein said first and second primary windings include first and second conductors inserted through the bore of said first toroidal core whereby said currents flowing in said first and second conductors flow into said bore of said first toroidal core in opposite directions.

7. A ground fault sensing circuit as claimed in claim 6 wherein said secondary winding has an even number of turns with a first half of said turns being wound about a first winding portion displaced from said gap in said first core; a remaining half of said turns being wound about another winding portion diametrically opposed to said first winding portion of said first core and connected to said first half of said turns in series additive manner.

8. Ground fault sensing means as set forth in claim 1 wherein the means for energizing the control winding includes first circuit means for inducing a flow of current in said control winding sufficient to magnetically saturate said saturable section; and second circuit means coupled to said secondary winding for producing an output voltage of varying magnitude responsive to the difference in the mangitudes of the currents flowing in said first and second primary windings.

9. Ground fault sensing means as set forth in claim 8 wherein said first circuit means includes first semiconductor switching means coupled to a first terminal of said control winding whose other terminal is connected to an energy supply of a first predetermined magnitude; first means coupled to said first semiconductor switching element and to an input terminal of said first circuit means for biasing said first semiconductor switching element in a cut-off condition responsive to a first voltage level at said input terminal, whereby no saturation current flows through said saturation winding, and for biasing said first semiconductor switching element into a conducting state responsive to a second voltage level at said input terminal, whereby a flow of current sufficient to saturate said first core saturation portion is induced to flow in said saturation winding.

10. Ground fault sensing means as set forth in claim 9 wherein said second circuit means includes first semiconductor amplifier means coupled to a first terminal of said secondary winding whose other terminal is coupled to a second energy source of a second predetermined value; and second means for biasing said first semiconductor amplifier means to generate an output voltage linearly proportional to the magnitude of the voltage across said secondary winding.

11. Ground fault sensing means as set forth in claim 8 wherein said first circuit means input terminal receives a train of pulses having a pulse peak voltage equal to said second input voltage level and a resting voltage between pulses equal to said first input voltage level, thereby periodically sampling the difference between said first and second conductor currents.

12. Ground fault sensing means as set forth in claim 11 wherein said pulse train is further characterized by each pulse having a time duration sufficient to drive the core into saturation.

13. Ground fault sensing means as set forth in claim 12 further characterized by each pulse having a maximum leading edge rise time substantially shorter than the pulse time duration.

14. Ground fault sensing means as set forth in claim 11 further characterized by means for synchronizing said pulses at said first circuit means input to the frequency of said A.C. energy source, whereby said pulse of saturation winding current is induced at a predetermined time relative to the start of each cycle of said A.C. energy source.

15. A ground fault sensing circuit, comprising:
a differential transformer including a magnetic core having a saturable section;
said magnetic core including a first generally toroidal core portion having a radial width entending from the bore of said first toroidal core portion to the exterior edge of said first toroidal core portion furthest from a center axis of rotation thereof and having an axial length extending between a front and a back plane lying perpendicular to said center axis of rotation of said first toroidal core portion;
said first generally toroidal core portion including at least one radial slot cut therein, each said slot having a radial length substantially equal to said radial lenght of said first toroidal core portion;
said saturable section including a second generally toroidal core portion having a center axis of rotation which is perpendicular to said center axis of rotation of said first generally toroidal core portion, said second generally toroidal core portion formed between said front and back planes of said first toroidal core portion and partially radially exterior to the periphery of said first toroidal core portion, said second toroidal core portion partially including the cross-sectional portion of said main section adjacent either side of each said slot, whereby a magnetic field induced to flow through said second toroidal core portion is in a direction generally transverse to a direction of a magnetic field induced to flow in said first toroidal core portion;
a first primary winding connected between one terminal of an A.C. source and one terminal of a load, a second primary winding connected between a second terminal of said A.C. source and a second terminal of said load, said primary windings being coupled to said first toroidal core portion in such a manner as to produce oppositely directed fluxes in said first toroidal core portion, said fluxes normally flowing through said saturable section;
a secondary winding coupled to said first toroidal core section to have induced therein a voltage related to differential currents flowing in said primary windings;
a control winding coupled to said second toroidal core portion;
means for periodically energizing said control winding so as to periodically drive said second toroidal core portion into saturation at a relatively rapid rate whereby said oppositely directed fluxes induced in said first toroidal core portion change at a relatively rapid rate thereby increasing the magnitude of said voltage induced in said secondary winding.

16. Ground fault sensing means as set forth in claim 15 wherein said control winding includes a plurality of turns of conductive material wound about the periphery of said first toroidal core and through the bore of each second toroidal core and insulated from the material thereof.

17. Ground fault sensing means as set forth in claim 16 wherein said first and second primary windings include first and second conductors inserted through the bore of said first toroidal core, whereby said currents flowing in said first and second conductors flow into said bore in opposite directions.

18. Ground fault sensing means as set forth in claim 17 wherein said secondary winding has an even number of turns with a first half of said turns being wound about a first winding portion displaced from said core slot position of said first toroidal core; a remaining half of said turns being wound about another winding portion diametrically opposed to said first winding portion of said core and connected to said first half of said turns in a series additive manner.

19. a ground fault sensing circuit, comprising:
a magnetic core having a saturable section;
a first primary winding connected between one terminal of an A.C. source and one terminal of a load, a second primary winding connected between a second termainal of said A.C. source and a second terminal of said load, said primary windings being coupled to said magnetic core in such a manner as to produce oppositely directed fluxes in said magnetic core which normally flow through said saturable section;
a secondary winding coupled to said magnetic core to have induced therein a voltage related to differential currents flowing in said primary windings;
a control winding coupled to said saturable section;
means for periodically energizing said control winding so as to periodically drive said saturable section into saturation at a relatively rapid rate whereby said oppositely directed fluxes induced in said magnetic core change at a relatively rapid rate thereby increasing the magnitude of said voltage induce in said secondary winding;
said first primary winding on said source side being connected to ground through a neutral conductor;
additional means for detecting the presence of a ground connection between said load and said first primary winding, said additional means being coupled to said secondary winding and being adapted to detect the presence of a ground connection between the load and said first primary winding by energizing said secondary winding during time intervals between the spaced time intervals during which said control winding is energized whereby the same magnetic core is utilized for detection of a ground fault in either load line connected to said primary windings.

20. Ground fault sensing means as set forth in claim 19 wherein said additional means includes third circuit means for injecting a predetermined flow of current into said secondary winding; and fourth circuit means coupled to said secondary winding for generating an output voltage proportional to the magnitude of a voltage formed across the first primary winding responsive to a neutral line current induced in said first primary winding by said predetermined secondary current and flowing through a ground on the load side of said first primary winding.

21. Ground fault sensing means as set forth in claim 20 wherein said third circuit means includes second semiconductor switching means coupled to said first terminal of said secondary winding; and third means coupled between said energy source, said second semiconductor switching means and a third circuit means input for biasing said second semiconductor switching means in a cut-off condition responsive to a third voltage level at said third means input, whereby no current flows through said secondary winding, and for biasing said second semiconductor switching element to inject said predetermined flow of current into said secondary winding responsive to a fourth voltage level at said third means input.

22. Ground fault sensing means as set forth in claim 21 wherein said fourth circuit means includes second semiconductor amplifier means coupled to said first terminal of said secondary winding; and fourth means for biasing said second semiconductor amplifier means to generate an output voltage proportional to the magnitude of the voltage across said secondary winding.

23. Ground fault sensing means as set forth in claim 20 wherein said third circuit means injects said predetermined flow of current in said secondary winding responsive to a pulse signal at said third circuit means input; said current injecting pulse appearing at said third circuit means input during said time interval between successive current saturation pulses coupled to said first circuit means input.

24. Ground fault sensing means as set forth in claim 20 wherein said third circuit means further includes reactance means coupled across said second winding for generating said fourth circuit means output voltage as an oscillating signal voltage having a frequency substantially greater than the frequency of said A.C. energy source; and said third circuit means is adapted to be in a saturated condition when said predetermined flow of current is not being injected into said secondary winding, whereby the oscillations in said secondary winding and said parallel connected reactance element are damped.

* * * * *

UNITED STATES PATENT OFFICE
CERTIFICATE OF CORRECTION

Patent No. 4,021,729            Dated May 3, 1977

Inventor(s) Edward C. Hudson, Jr.

It is certified that error appears in the above-identified patent and that said Letters Patent are hereby corrected as shown below:

Column 8, line 33 - Delete "enegizing" and replace by --energizing--

Column 8, line 68 - Delete "porition" and replace by --portion--

Column 9, line 13 - Delete "mangitudes" and replace by --magnitudes--

Column 9, line 41 - Delete "8" and replace by --9--

Column 9, line 66 - Delete "entending" and replace by --extending--

UNITED STATES PATENT OFFICE
CERTIFICATE OF CORRECTION

Patent No. 4,021,729　　　　　　　　　Dated  May 3, 1977

Inventor(s)　Edward C. Hudson, Jr.

It is certified that error appears in the above-identified patent and that said Letters Patent are hereby corrected as shown below:

Column 10, line 8 - Delete "lenght" and replace by --length--

Column 11, line 1 - Delete "a" and replace by --A--

Column 11, line 6 - Delete "termainal" and replace by --terminal--

Column 11, line 21 - Delete "induce" and replace by --induced--

Signed and Sealed this

Fifth Day of September 1978

[SEAL]

Attest:

RUTH C. MASON
Attesting Officer

DONALD W. BANNER
Commissioner of Patents and Trademarks